US012808726B2

(12) United States Patent
Nakanishi et al.

(10) Patent No.: US 12,808,726 B2
(45) Date of Patent: Nov. 24, 2026

(54) TEMPERATURE CONTROL SYSTEM, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Kento Nakanishi, Toyama (JP); Hideto Yamaguchi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 230 days.

(21) Appl. No.: 18/591,209

(22) Filed: Feb. 29, 2024

(65) Prior Publication Data

US 2024/0319021 A1 Sep. 26, 2024

(30) Foreign Application Priority Data

Mar. 24, 2023 (JP) ................................ 2023-049102

(51) Int. Cl.
*G01K 7/04* (2006.01)
*G01K 7/42* (2006.01)
(Continued)

(52) U.S. Cl.
CPC ............... *G01K 7/427* (2013.01); *G01K 7/04* (2013.01); *H10P 72/0602* (2026.01); *H10P 74/203* (2026.01); *C23C 16/52* (2013.01)

(58) Field of Classification Search
CPC .......... G01K 1/14; G01K 1/143; G01K 1/146; G01K 7/04; G01K 7/427; H10P 72/0434;
(Continued)

(56) References Cited

U.S. PATENT DOCUMENTS

2002/0014483 A1 2/2002 Suzuki et al.
2002/0055080 A1 5/2002 Tanaka et al.
(Continued)

FOREIGN PATENT DOCUMENTS

JP 2002175123 A 6/2002
JP 2005159317 A 6/2005
(Continued)

OTHER PUBLICATIONS

Computer translation of KR 2009/0026059_A (Year: 2026).*
(Continued)

*Primary Examiner* — Randy W Gibson
(74) *Attorney, Agent, or Firm* — Volpe Koenig

(57) ABSTRACT

There is provided a technique that includes: a heater arranged in each of a plurality of zones; at least one first temperature sensor configured to be capable of operating in conjunction with at least one substrate; another temperature sensor aside from the at least one first temperature sensor; and a controller configured to be capable of controlling the heater based on a temperature detected by either the at least one first temperature sensor or the another temperature sensor, wherein the either the at least one first temperature sensor or the another temperature sensor is assigned to each of the plurality of zones.

18 Claims, 10 Drawing Sheets

(51) Int. Cl.
*H10P 72/00* (2026.01)
*H10P 74/20* (2026.01)
*C23C 16/52* (2006.01)

(58) Field of Classification Search
CPC ... H10P 72/0436; H10P 72/0602; C23C 16/52
See application file for complete search history.

(56) References Cited

U.S. PATENT DOCUMENTS

| | | | | |
|---|---|---|---|---|
| 2006/0188240 | A1 | 8/2006 | Tanaka et al. | |
| 2007/0074660 | A1 | 4/2007 | Park et al. | |
| 2008/0203084 | A1 | 8/2008 | Yamaga | |
| 2009/0095422 | A1 | 4/2009 | Sugishita et al. | |
| 2009/0105867 | A1* | 4/2009 | Yamaguchi | H10P 72/0602 700/121 |
| 2012/0223066 | A1 | 9/2012 | Yoshii et al. | |
| 2012/0258415 | A1* | 10/2012 | Yoshii | H10P 72/0434 432/9 |
| 2016/0245704 | A1* | 8/2016 | Osaka | G01K 1/14 |
| 2021/0181033 | A1 | 6/2021 | Akao et al. | |
| 2022/0390288 | A1* | 12/2022 | Enomoto | C23C 16/52 |

FOREIGN PATENT DOCUMENTS

| | | | |
|---|---|---|---|
| JP | 2008-244449 | A | 10/2008 |
| JP | 2009-081415 | A | 4/2009 |
| KR | 20090026059 | A | 3/2009 |
| WO | 2005/010970 | A1 | 2/2005 |
| WO | 2020/0059722 | A1 | 3/2020 |

OTHER PUBLICATIONS

Taiwan Office Action issued on Mar. 13, 2025 for Taiwan Patent Application No. 113104454.

Extended European Search Report dated Aug. 20, 2024 for European Patent Application No. 24160470.1.

Korean Office Action issued on Jan. 17, 2025 for Korean Patent Application No. 10-2024-0031452.

Japanese Office Action issued on Jul. 28, 2026 for Japanese Patent Application No. 2023049102.

* cited by examiner

FIG. 8A

| BTCU | None/Type1 |
|---|---|

| BCH | CH assignment |
|---|---|
| 1 | 00 |
| 2 | 00 |
| 3 | 00 |
| 4 | 00 |
| 5 | 00 |

FIG. 8B

| | U | CU | C | CL | L |
|---|---|---|---|---|---|
| CTC | 06 | 07 | 08 | 09 | 10 |
| HTC | 01 | 02 | 03 | 04 | 05 |

FIG. 9A

| BTCU | Type1 |
|---|---|

| BCH | CH assignment |
|---|---|
| 1 | 07 |
| 2 | 08 |
| 3 | 09 |
| 4 | 00 |
| 5 | 00 |

| | | | | | |
|---|---|---|---|---|---|
| CTC | 06 | BCH1 | BCH2 | BCH3 | 10 |
| HTC | 01 | 02 | 03 | 04 | 05 |

FIG. 9B

| BTCU | Type1 |
|---|---|

| BCH | CH assignment |
|---|---|
| 1 | 01 |
| 2 | 02 |
| 3 | 03 |
| 4 | 04 |
| 5 | 05 |

| | | | | | |
|---|---|---|---|---|---|
| CTC | 06 | 07 | 08 | 09 | 10 |
| HTC | BCH1 | BCH2 | BCH3 | BCH4 | BCH5 |

FIG. 9C

| BTCU | None |
|---|---|

| BCH | CH assignment |
|---|---|
| 1 | 01 |
| 2 | 02 |
| 3 | 03 |
| 4 | 04 |
| 5 | 05 |

| | | | | | |
|---|---|---|---|---|---|
| CTC | 06 | 07 | 08 | 09 | 10 |
| HTC | 01 | 02 | 03 | 04 | 05 |

TEMPERATURE CONTROL SYSTEM, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2023-049102, filed on Mar. 24, 2023, the entire contents of which are incorporated herein by reference.

TECHNICAL FIELD

The present disclosure relates to a temperature control system, a method of manufacturing a semiconductor device, a substrate processing apparatus, and a recording medium.

BACKGROUND

In the related art, as a process of manufacturing a semiconductor device, a predetermined process is performed on a wafer (hereinafter also referred to as "substrate"). Specifically, in the related art, there is disclosed a technique of controlling a temperature of a process chamber by using a temperature detected by a temperature sensor provided at a boat (hereinafter also referred to as "holder").

SUMMARY

Some embodiments of the present disclosure provide a technique capable of improving a temperature controllability of a process space where a substrate is placed.

According to some embodiments of the present disclosure, there is provided a technique that includes: a heater arranged in each of a plurality of zones; at least one first temperature sensor configured to be capable of operating in conjunction with at least one substrate; another temperature sensor aside from the at least one first temperature sensor; and a controller configured to be capable of controlling the heater based on a temperature detected by either the at least one first temperature sensor or the another temperature sensor, wherein the either the at least one first temperature sensor or the another temperature sensor is assigned to each of the plurality of zones.

BRIEF DESCRIPTION OF DRAWINGS

The accompanying drawings, which are incorporated in and constitute a part of the specification, illustrate embodiments of the present disclosure.

FIG. 8A is a diagram illustrating an assignment parameter including a setting item for whether or not a substrate thermocouple unit function is invalid and a setting item for an assignment destination of temperature data for a substrate thermocouple. FIG. 8B is a diagram illustrating a configuration of an assignment destination of temperature data for a substrate thermocouple.

FIG. 9A is a diagram illustrating an assignment parameter when assigning a substrate thermocouple in CU, C, and CL zones instead of an internal thermocouple in CU, C, and CL zones. FIG. 9B is a diagram illustrating an assignment parameter when assigning a substrate thermocouple in U, CU, C, CL, and L zones instead of a heater thermocouple in U, CU, C, CL, and L zones. FIG. 9C is a diagram illustrating an assignment parameter when there is no assignment of a substrate thermocouple.

DETAILED DESCRIPTION

Figure 1:
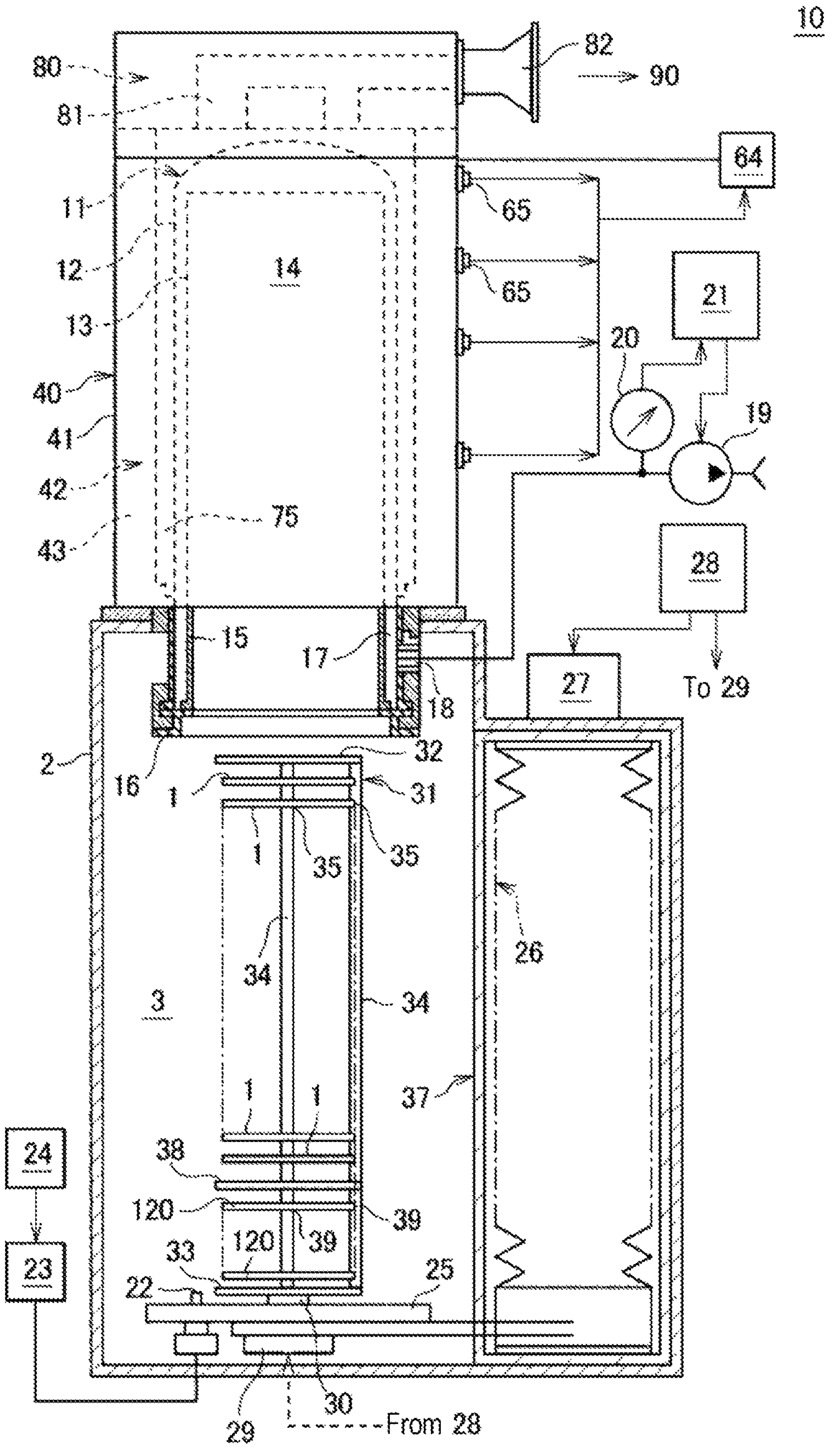
FIG. 1 is a front cross-sectional view of a substrate processing apparatus according to embodiments of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Hereinafter, embodiments of the present disclosure will be described. In addition, the drawings used in the following description are schematic, and dimensional relationships, ratios, and the like of the respective components shown in the drawings may not match actual ones. Further, dimensional relationships, ratios, and the like of the respective components among plural drawings may not match one another. Further, the same reference numerals are given to substantially the same components among the plural drawings, and descriptions of the respective components are given in the drawings in which the respective components first appear, and the descriptions are omitted in the subsequent drawings, unless specifically demanded. Unless otherwise mentioned in the present disclosure, each component is not limited to one and may be present in plurality.

As illustrated in FIG. 1, a substrate processing apparatus 10 includes a vertically supported reaction tube (process tube) 11. The reaction tube 11 includes an outer tube 12 and an inner tube 13, which are arranged concentrically with each other. The outer tube 12 is made of quartz ($SiO_2$) and is integrally molded into a shape of a cylinder with a closed upper end and an open lower end. The inner tube 13 is formed in a shape of a cylinder with open upper and lower ends. A cylindrical hollow space in the inner tube 13 forms a process chamber 14 into which a boat 31, serving as a substrate support (substrate holder or retainer), is loaded. The lower end side (opening) of the inner tube 13 constitutes a furnace opening 15 for entrance or exit of the boat 31.

A gap between the lower ends of the outer tube 12 and the inner tube 13 is hermetically sealed by a manifold 16, serving as a furnace opening flange, constructed in a substantially cylindrical shape. The manifold 16 is detachably attached to each of the outer tube 12 and the inner tube 13, for the replacement of the outer tube 12 and the inner tube 13, etc.

An exhaust path 17 is constructed by the gap between the outer tube 12 and the inner tube 13 to take a transverse cross-sectional shape in the form of a circular ring with a constant width. As illustrated in FIG. 1, one end of an exhaust pipe 18 is connected to a sidewall upper side of the manifold 16, and the exhaust pipe 18 is in fluid communication with a lowest end side of the exhaust path 17. An exhauster 19, which is controlled by a pressure controller 21, is connected to the other end of the exhaust pipe 18, and a pressure sensor 20 is connected to the middle of the exhaust pipe 18. The pressure controller 21 is configured to feedback-control the exhauster 19 based on measurement results from the pressure sensor 20.

A lid (seal cap) 25 is brought into contact with the manifold 16 from below in a vertical direction to close a lower end opening of the manifold 16. The lid 25 is formed in a shape of a disc with an outer diameter substantially equal to that of the manifold 16, and is configured to be vertically raised or lowered by an elevator (boat elevator) 26, which is protected by a boat cover 37 provided at a transfer chamber (transport chamber) 3 of a housing 2. This allows the boat 31 to move between the process chamber 14 and the transfer chamber 3, which is provided adjacent to and below the process chamber 14. The elevator 26 is constituted by a motor-driven feed screw shaft apparatus, a bellows, etc., and a motor 27 of the elevator 26 is configured to be controlled by a drive controller 28. A rotation shaft 30 is positioned on a center axis of the lid 25 and is rotatably supported. The rotation shaft 30 is configured to be rotationally driven by a motor 29 controlled by the drive controller 28. The boat 31 is vertically supported on an upper end of the rotation shaft 30. In embodiments of the present disclosure, the rotation shaft 30 and the motor 29 constitute a rotator.

A gas introduction pipe 22 is disposed at the lid 25 located below the manifold 16, to be in fluid communication with the furnace opening 15 of the inner tube 13. The gas introduction pipe 22 is connected to a precursor gas supplier, a reaction gas supplier, and an inert gas supplier (hereinafter collectively referred to as a gas supplier 23). The gas supplier 23 is configured to be controlled by a gas flow rate controller 24. A gas introduced into the furnace opening 15 from the gas introduction pipe 22 circulates inside the process chamber 14 of the inner tube 13, then passes through the exhaust path 17, and is discharged via the exhaust pipe 18.

The boat 31 includes a pair of top and bottom end plates 32 and 33 and pillars (columns) 34 as three holders vertically mounted between them, and multiple holding grooves 35 are carved on the three pillars 34 at equal intervals in a longitudinal direction. The holding grooves 35 carved at the same level on the three pillars 34 are open to face each other. Each substrate 1 is inserted among the holding grooves 35 at the same level on the three pillars 34, such that the boat 31 holds a plurality of substrates 1 horizontally with centers of the substrates 1 aligned one another. Further, each heat insulation plate 120 is inserted among holding grooves 39 at the same level on the three pillars 34, such that the boat 31 holds a plurality of heat insulation plates 120 horizontally with centers of the heat insulation plates 120 aligned one another.

In other words, the boat 31 is configured to distinguish between a substrate process region between an end plate 32 and an end plate 38 where the plurality of substrates 1 are held and a heat insulation plate region between the end plate 38 and an end plate 33 where the plurality of heat insulation plates 120 are held, while the heat insulation plate region is located below the substrate process region. The heat insulation plates 120 held between the end plates 38 and 33 constitute a heat insulator 36.

The rotation shaft 30 is configured to support the boat 31 in a raised state from an upper surface of the lid 25. The heat insulator 36 is provided at the furnace opening 15 and is configured to thermally insulate the furnace opening 15. Further, the motor 29 configured to rotate the boat 31 is provided below the lid 25. The motor 29 is in a hollow motor structure, with the rotation shaft 30 passing through the motor 29.

A heater unit 40, serving as a heater, is arranged concentrically outside the reaction tube 11 and is provided while being supported by the housing 2. A heater thermocouple 65 (hereinafter, also referred to as a "third temperature sensor") is provided in the vicinity of the heater unit 40, and a temperature controller 64 is configured to feedback-control the heater unit 40 based on the measurement results obtained from the heater thermocouple 65. This allows the heater unit 40 to heat the substrate 1 held by the boat 31 within the substrate process region.

As illustrated in FIG. 1, a sidewall 43 of a heat insulation structure 42 installed inside a case 41 is covered at an upper end with a ceiling wall 80 serving as a ceiling such that a space 75 is closed. The ceiling wall 80 includes an exhaust hole 81 formed in an annular shape as a part of an exhaust path for evacuating the atmosphere of the space 75, and the lower end, which is the upstream end, of the exhaust hole 81 is in fluid communication with the inner space 75. The downstream end of the exhaust hole 81 is connected to an exhaust duct 82. Then, cooling air 90 ejected into the space 75 is discharged via the exhaust hole 81 and the exhaust duct 82.

Figure 2:
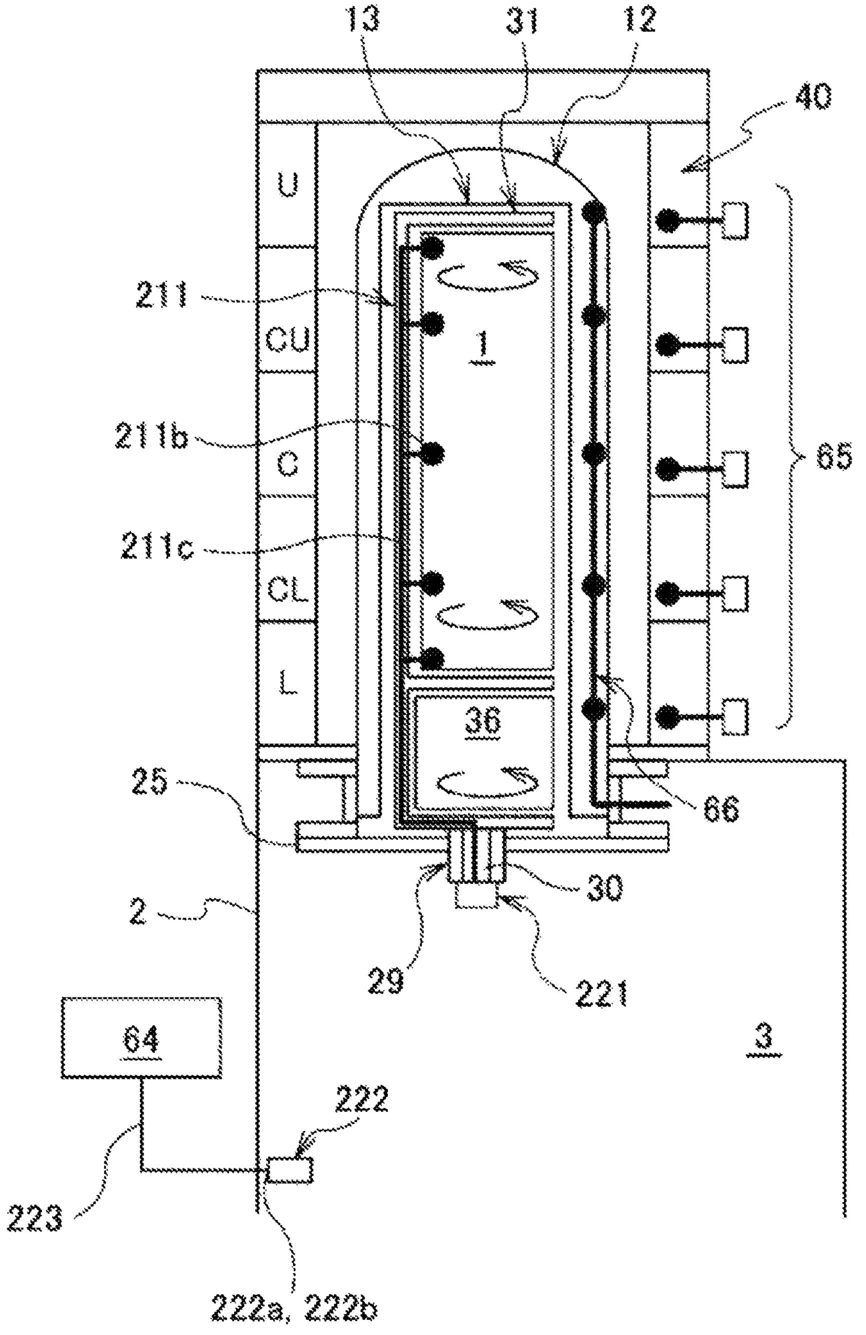
FIG. 2 is a schematic diagram illustrating a state of a substrate processing apparatus according to embodiments of the present disclosure, at the time of boat loading.

As illustrated in FIG. 2, the heater unit 40 is divided into a plurality of independently controllable zones in a vertical direction, with a heater installed for each zone, such that a plurality of heaters overlap each other. The heater unit 40 is divided into 5 zones such as U, CU, C, CL, and L zones. Then, the heater thermocouple 65 configured to measure the temperature of the heater for each zone, an internal thermocouple 66, and a substrate thermocouple 211 are installed. In FIG. 2, the processing substrate is denoted as "1" and the illustration thereof is omitted.

The internal thermocouple 66 (hereinafter, also referred to as a "second temperature sensor") is installed at the interior (process space) of the outer tube 12 to measure a temperature between the inner tube 13 and the outer tube 12. The internal thermocouple 66 is in a structure in which a number of thermocouples corresponding to the number of zones are accommodated within one quartz tube. Then, temperature measurement points thereof are provided at positions facing the respective zones. The temperature controller 64 is configured to feedback-control the heater unit 40 based on the measurement results obtained from the internal thermocouple 66 as in the heater thermocouple 65.

The substrate thermocouple 211, serving as a first temperature sensor, configured to measure a temperature of the substrate 1 is provided at the boat 31, and is configured to rotate together with the substrate 1 when the boat 31 rotates to rotate the substrate 1. The substrate thermocouple 211 is configured to be raised or lowered together with the substrate 1 when the boat 31 is raised or lowered. The substrate thermocouple 211 is configured to include a temperature detector 211*b* that is configured to measure the temperature of the substrate 1 and a cable 211*c* including a wire constituting the temperature detector 211*b*. As illustrated in FIG. 2, an example is illustrated in which the temperature detectors 211*b* are provided at positions facing the respective zones. The substrate thermocouple 211, the internal thermocouple 66, and the heater thermocouple 65 are arranged such that heights of their respective temperature detectors are substantially the same. The temperature controller 64 is configured to feedback-control the heater unit 40 based on the measurement results obtained from the substrate thermocouple 211 as in the heater thermocouple 65 and the internal thermocouple 66.

In addition, the first temperature sensor, the second temperature sensor, and the third temperature sensor are not limited to the thermocouples as long as they may measure temperatures as electric signals, but may also be other sensors such as temperature-sensitive resistors. Further, as another temperature sensor aside from the first temperature sensor, either the second temperature sensor or the third temperature sensor is indicated.

The rotation shaft 30 includes a bore through which the cable 211*c* passes and is structured to allow the cable 211*c* to be pulled out to a transmitter 221 outside the process chamber 14 (e.g., below the rotation shaft 30) while being vacuum-sealed by using a hermetic seal, etc. The cable 211*c* is connected to the transmitter 221 below the lid 25.

The transmitter 221 is fixed to the rotation shaft 30 and is configured to move together with the rotation shaft 30. The transmitter 221 digital-converts electric signals (voltages) input via the cable 211*c* from the substrate thermocouple 211 to transmit the converted signals wirelessly by radio waves.

A receiver 222 is fixed to the housing 2 of the transfer chamber 3 below the lid 25. The receiver 222 receives the signals emitted from the transmitter 221, and includes a terminal (output terminal) 222*a* for a serial communication output of the received digital signals, or a terminal (output terminal) 222*b* configured to convert the received digital signals into analog signals such as 4 mA to 20 mA to output the same. A cable 223 is used to connect an output signal terminal of these digital signals or analog signals, a temperature indicator (not illustrated), and the temperature controller 64, enabling the input of temperature data to the temperature controller 64. In addition, the receiver 222 is provided at the transfer chamber 3, but is not limited thereto. The receiver 222 may be located outside the transfer chamber 3, or may be located at a position away from the substrate processing apparatus 10.

Figure 3A:
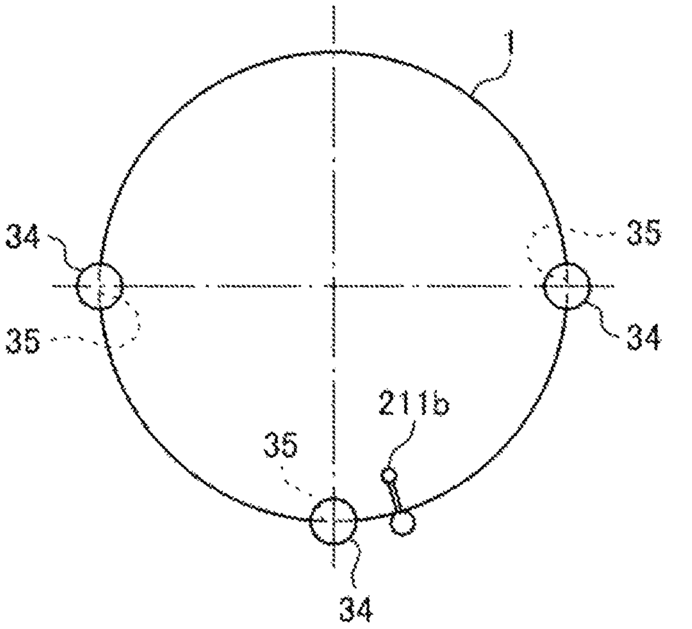
FIG. 3A is a plane view illustrating a placement of a substrate thermocouple according to embodiments of the present disclosure.
Figure 3B:
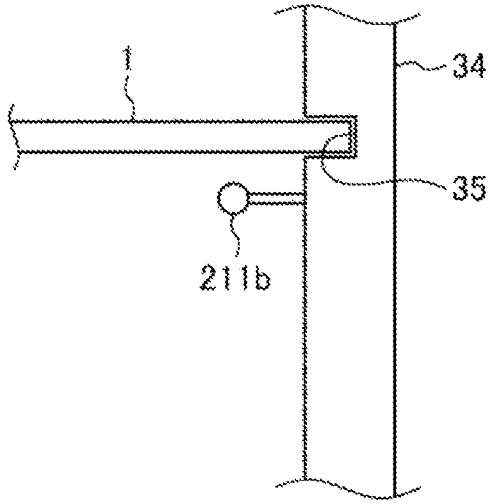
FIG. 3B is a side view illustrating a placement of a substrate thermocouple according to embodiments of the present disclosure.

As illustrated in FIGS. 3A and 3B, the temperature detector 211*b* of the substrate thermocouple 211 is positioned at a periphery of the substrate 1 (inside a peripheral end). Further, in FIG. 3A, the temperature detector 211*b* of the substrate thermocouple 211 is positioned in the vicinity of the pillar 34. Here, "in the vicinity of the pillar 34" means that it is positioned closer to the pillar 34 than an intermediate position between the pillar 34 and the center of the substrate 1 in a state where the substrate 1 is held by the pillar 34. As such, according to FIGS. 3A and 3B, since the substrate thermocouple 211 (temperature detector 211*b*) is positioned in a space where the substrate 1 is processed (a space between substrates), it is possible to measure a temperature of a process space closer to the substrate 1 than the heater thermocouple 65 or the internal thermocouple 66. This enables more accurate measurement of the temperature of the substrate 1. In addition, although omitted here to clarify the placement of the temperature detector 211*b*, a protective tube is provided to isolate the temperature detector 211*b* from the process space. The protective tube is, for example, made of quartz.

Figure 4:
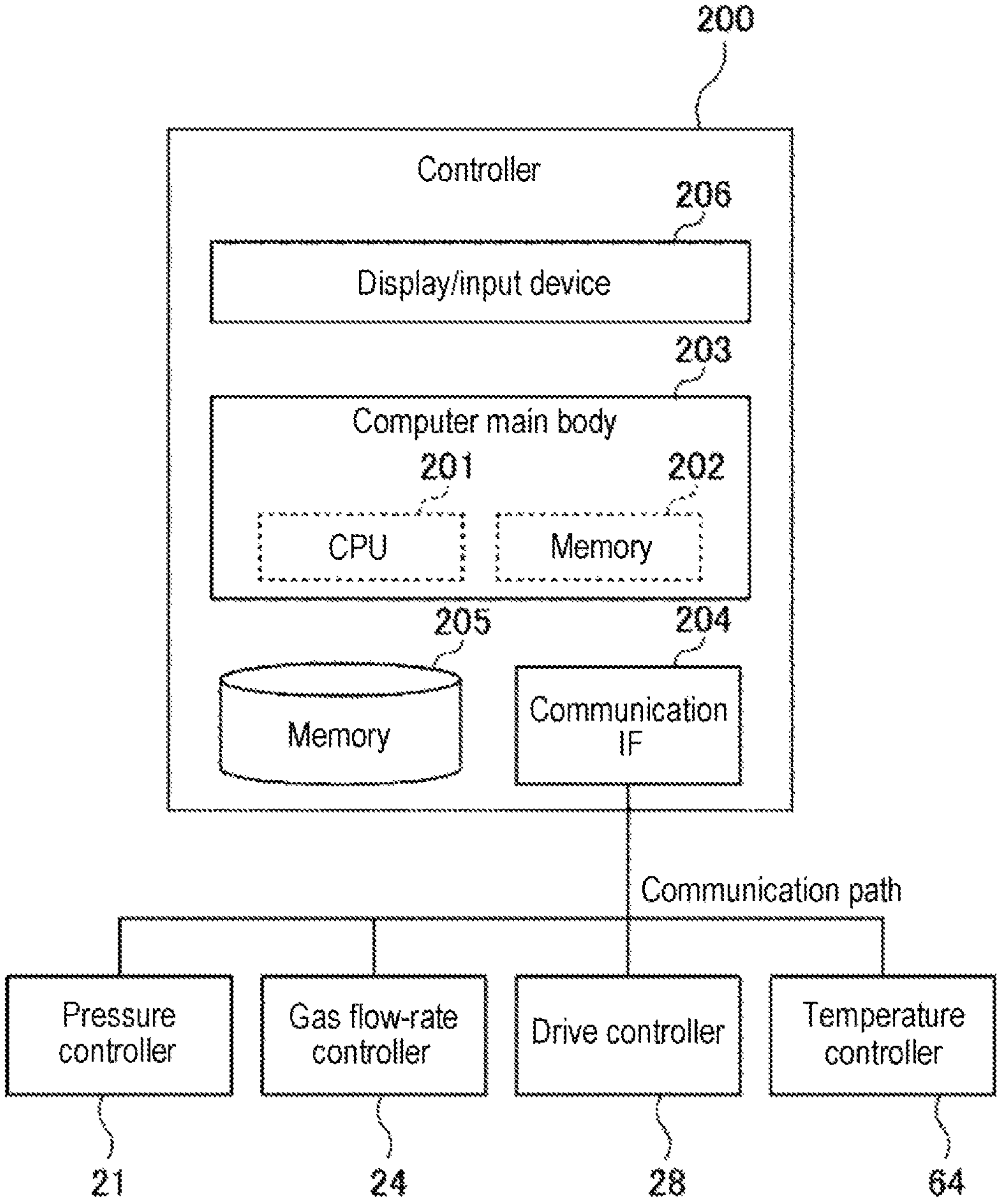
FIG. 4 is a diagram illustrating a hardware configuration of a controller in the substrate processing apparatus according to embodiments of the present disclosure.

As illustrated in FIG. 4, a controller 200, which is a control computer serving as a control part, includes a computer main body 203 including a central processing unit (CPU) 201 serving as a core, a memory 202, and the like, a communication interface (IF) 204 serving as a communicator, a memory 205 serving as a memory part, and a display/input device 206 serving as a displayer (operator). In other words, the controller 200 includes components as a general computer.

The CPU 201 constitutes a core of the operator, and executes a control program stored in the memory 205, thus executing recipes (e.g., process recipes) recorded in the memory 205 in response to instructions from the displayer 206. Further, the memory 202 serving as a temporary memory functions as a work area for the CPU 201.

Further, a way of supplying programs to the computer is not limited to supplying the programs via the memory 205. For example, a communication facility such as the Internet or dedicated lines may be used to supply the programs without going through the memory 205. In addition, the memory 202 or the memory 205 is configured as a computer-readable recording medium. Hereinafter, these are collectively referred to as a recording medium. In addition, when the term "recording medium" is used herein, it may refer to the memory 202, the memory 205, or both of them.

The communication IF 204 serving as a communicator is electrically connected to the pressure controller 21, the gas flow rate controller 24, the drive controller 28, and the temperature controller 64 (sometimes collectively referred to as a sub-controller) via a communication path. The controller 200 may exchange data regarding an operation of each component, with the sub-controller through the communication IF 204.

Figure 5:
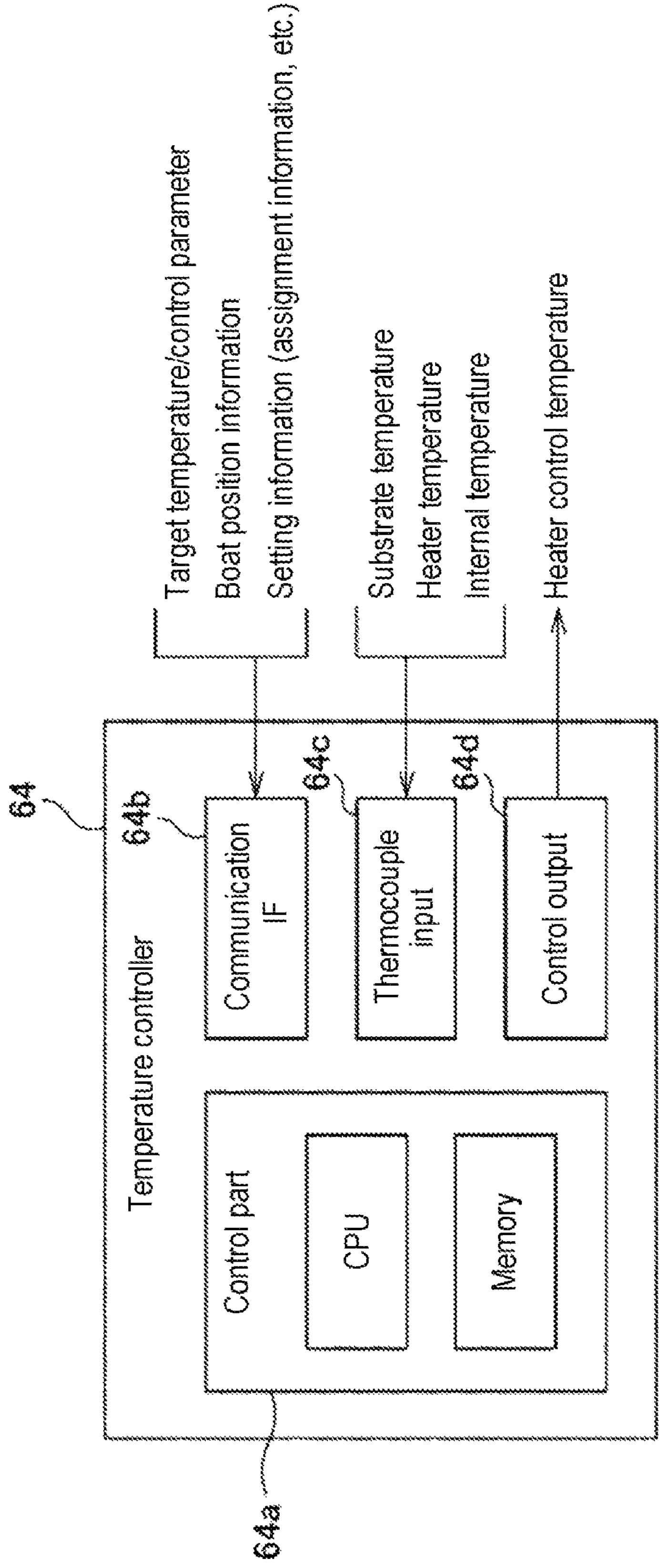
FIG. 5 is a diagram illustrating a hardware configuration of a temperature controller in a substrate processing apparatus according to embodiments of the present disclosure.

As illustrated in FIG. 5, the temperature controller 64 includes a control part 64*a*, a communication IF 64*b*, a thermocouple input 64*c*, and a control output 64*d*.

The control part 64*a* includes a hardware configuration as a general computer including a CPU, a memory, and the like. By executing a control program, the control part 64*a* executes control calculations according to a temperature control algorithm to be described later, by using information acquired by the communication IF 64*b* and the thermocouple input 64*c*, thus outputting calculation results to the control output 64*d*.

The communication IF 64*b* includes a wired IF for connection to a host controller such as the controller 200. The communication IF 64*b* receives information such as a target temperature and control parameters from the controller 200, or transmits control calculation results or temperature information. Further, the communication IF 64*b* receives boat position information from the drive controller 28 of the elevator 26. Further, the communication IF 64*b* receives setting information set in the displayer 206 including assignment information, and the like. The received information is temporarily stored in the memory. In addition, the setting information will be described later.

The thermocouple input 64*c* includes a receiver 222 that is a wireless IF for connection to the transmitter 221 fixed to the boat 31. Further, the thermocouple input 64*c* inputs electrical signals corresponding to the temperatures from the substrate thermocouple 211, the heater thermocouple 65, and the internal thermocouple 66, converts these signals into digital signals, and outputs the same to the control part 64*a*. The control output 64*d* outputs a heater control signal for performing the temperature control of the heater unit 40 based on the calculation results received from the control part 64*a*.

In the following description, a temperature detected by the heater thermocouple 65 is referred to as a heater temperature, and the temperature control using the heater thermocouple 65 is referred to as heater temperature control. Further, a temperature detected by the substrate thermocouple 211 is referred to as substrate temperature, and temperature control using the substrate thermocouple 211 is referred to as substrate temperature control. Further, a temperature detected by the internal thermocouple 66 is referred to as an internal temperature, and temperature control using the internal thermocouple 66 is referred to as internal temperature control.

Figure 6:
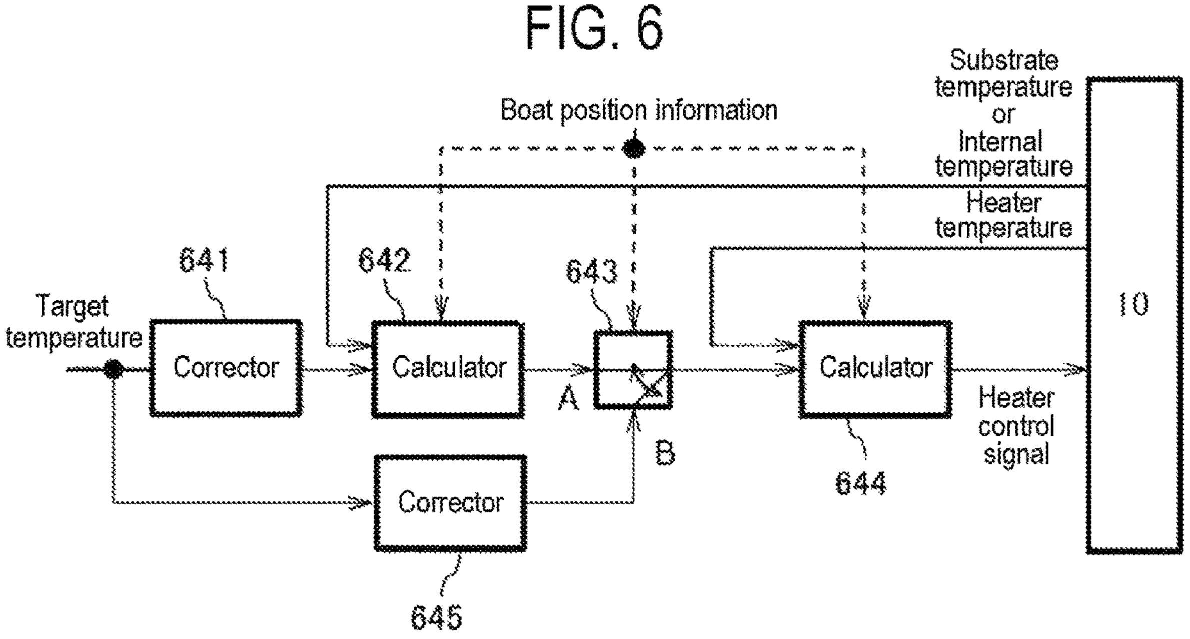
FIG. 6 is a control block diagram of a temperature controller in a substrate processing apparatus according to embodiments of the present disclosure.

Next, an example of a control block of the temperature controller 64 in the embodiments of the present disclosure will be described with reference to FIG. 6. The control block is configured for each zone of the heater unit 40 and is collectively represented in FIG. 6 since the configuration of each zone is the same.

The control block includes a mode in which a corrector 641, a calculator 642, a switch 643, and a calculator 644 are connected in sequence, and a mode in which a corrector 645, a switch 643, and a calculator 644 are connected in sequence. The boat position information is input to the calculator 642, the switch 643, and the calculator 644.

The temperature controller 64 selects an input terminal of the switch 643 according to the boat position information. Further, the temperature controller 64 is configured to be capable of selecting either the internal thermocouple 66 or the substrate thermocouple 211 for each zone based on the setting information.

When the boat 31 is located at a closed position (process chamber 14), the temperature controller 64 selects an input terminal "A" of the switch 643 for the zone where the substrate thermocouple 211 or internal thermocouple 66 is set in the setting information, and performs a temperature control by using the substrate temperature or the internal temperature, along with the heater temperature, as a control target quantity. For example, the temperature controller 64 is configured to perform a PID control.

When the boat 31 is located at a position (for example, the transfer chamber 3) other than the closed position, the temperature controller 64 selects an input terminal "B" of the switch 643 to perform the temperature control by using the heater temperature as a control target quantity. For example, the temperature controller 64 is configured to perform the PID control.

The correctors 641 and 645 correct a target temperature according to differences between the target temperature when controlling the process chamber 14 to an equivalent temperature and the heater temperature and the substrate temperature or the internal temperature, etc.

Next, the setting information (sometimes also referred to as "assignment information") for the heater thermocouple 65, the internal thermocouple 66, and the substrate thermocouple 211 will be described with reference to FIGS. 8A and 8B. For example, the assignment information for the substrate thermocouple 211 is set by inputting assignment parameters illustrated in FIG. 8A (or left sides of FIGS. 9A to 9C) displayed on a screen of the displayer 206. Further, information on an assignment destination of each zone to which the substrate thermocouple 211 is assigned as illustrated in FIG. 8B (or right sides of FIGS. 9A to 9C) may also be included in the assignment parameters.

As illustrated in FIG. 8A, the displayer 206 displays a setting item "BTCU" indicating validity of a substrate thermocouple unit function (i.e., whether or not the substrate thermocouple 211 is in use) and a setting item "CH Assignment" indicating the assignment destination of temperature data for five temperature detectors 211*b* of the substrate thermocouple 211. On the displayer 206, such setting items (shaded fields illustrated in FIG. 8A) may be input (set). The set assignment parameters are temporarily stored in the memory 205. Further, FIG. 8A is an example in which there are five temperature detectors, but the number of temperature detectors may increase to 6 or more and is not limited to five in the embodiments of the present disclosure. For example, the embodiments of the present disclosure may apply to temperature data from ten temperature detectors.

In a case where "None" is input to the setting item "BTCU," the substrate thermocouple 211 is not used in the temperature control even when the setting item "CH Assignment" to be described later is input. On the other hand, in a case where "Type1" is input, the substrate thermocouple 211 is used in the temperature control.

The setting item "CH Assignment" is used to designate which of five temperature detectors of the heater thermocouple (HTC) 65 and five temperature detectors of the internal thermocouple (CTC) 66 as illustrated in FIG. 8B will be assigned with temperature data from five temperature detectors 211*b* (denoted as 1 to 5 in the "BCH" column) of the substrate thermocouple 211. As illustrated in FIG. 8A, when "00" is input to the "CH Assignment" column, there is no assignment of temperature data for the substrate thermocouple 211. Here, in a case where any one of "01" to "10" is input (set) to the "CH Assignment" column, any one of temperatures respectively assigned for zones indicated by "01" to "05" for the heater thermocouple (HTC) 65 and "06" to "10" for the internal thermocouple (CTC) 66 as illustrated in FIG. 8B is assigned to the temperature data for the substrate thermocouple 211. In other words, "01" to "10" illustrated in FIG. 8B are assignment destinations of the temperature data for the substrate thermocouple 211. Further, in a case where a number other than "01" to "10" is input to the "CH Assignment" column, the assignment is invalid. In other words, this is similar to the case where "00" is input to the "CH Assignment" column.

The displayer 206 is configured to display the setting information ("01" to "05") assigned to each zone of the heater thermocouple 65 and the setting information ("06" to "10") assigned to each zone of the internal thermocouple 66 as illustrated in FIG. 8B. For example, the displayer 206 may be configured to display the setting information on the same screen as the assignment parameters illustrated in FIG. 8A such that the setting information is included in the assignment parameters. Further, the setting information ("01" to "10") illustrated in FIG. 8B may be edited, thereby enabling the setting of the assignment destination of the temperature data for the substrate thermocouple 211. In addition, as illustrated in FIG. 8B, "01" to "05" for the heater thermocouple 65 respectively correspond to first to fifth zones, such as the U, CU, C, CL, and L zones. Similarly, "06" to "10" for the internal thermocouple 66 also respectively correspond to first to fifth zones, such as the U, CU, C, CL, and L zones.

FIGS. 9A to 9C illustrate specific setting examples. FIG. 9A is a setting example in which the substrate thermocouple 211 (BCH1 to BCH3) for the CU, C, and CL zones is assigned instead of the internal thermocouple 66 ("07" to "09") for the CU, C, and CL zones. With this setting, the temperature control is performed by using the temperature data for the substrate thermocouple 211 in the CU, C, and CL zones instead of the temperature data for the internal thermocouple 66 in the CU, C, and CL zones. In other words, according to the assignment parameters, the detected temperature information for the corresponding internal thermocouple 66 is overwritten with (or switched to) the detected temperature information for the substrate thermocouple 211. Then, the temperature control is performed by using the overwritten detected temperature (that is, temperature detected by the substrate thermocouple 211). This allows temperature control to be performed by using the substrate thermocouple 211 in the zone where the temperature detector of the substrate thermocouple 211 is installed and by using the internal thermocouple 66 in the zone where the temperature detector of the substrate thermocouple 211 is not installed.

FIG. 9B is a setting example in which the substrate thermocouple 211 (BCH1 to BCH5) for the U, CU, C, CL, and L zones is assigned instead of the heater thermocouple 65 ("01" to "05") for U, CU, C, CL, and L zones. In other words, the temperature control is performed by using the temperature data for the substrate thermocouple 211 in the U, CU, C, CL, and L zones instead of the temperature data for the heater thermocouple 65 in the U, CU, C, CL, and L zones. In other words, according to the assignment parameters, the detected temperature information for the corresponding heater thermocouple 65 is overwritten with (or switched to) the detected temperature information for the substrate thermocouple 211. Then, the temperature control is performed by using the overwritten detected temperature (that is, temperature detected by the substrate thermocouple 211). In this way, since the temperature detector of the substrate thermocouple 211 is installed for every zone, the temperature control is performed by using the substrate thermocouple 211 instead of the heater thermocouple 65.

FIG. 9C is a setting example in which there is no assignment of the substrate thermocouple 211 (BCH1 to BCH5). As illustrated in FIG. 9C, even in a case where the assignment destination of the temperature data for the substrate thermocouple 211 is input to the "CH Assignment" column, the temperature data for the substrate thermocouple 211 is not used for the temperature control.

As such, in the embodiments of the present disclosure, at least one selected from the group of the substrate thermocouple 211, internal thermocouple 66, and heater thermocouple 65 is arbitrarily selected for each zone according to contents preset by the assignment parameters. This allows the substrate thermocouple 211, the internal thermocouple 66, and the heater thermocouple 65 to be used in combination, thereby improving the temperature control in the process space of the substrate 1.

In embodiments of the present disclosure, for example, when the number of temperature detectors of the substrate thermocouple 211 is smaller than the number of zones, it is possible to detect the temperature in an extra zone by using the internal thermocouple 66 or the heater thermocouple 65. However, in this case, the setting item "CH Assignment" illustrated in FIG. 8A indicates the number of temperature detectors (alternatively, the number of zones is displayed, but the number of temperature detectors may be set). Further, even in this case, when "None" is input to the setting item "BTCU" illustrated in FIG. 8A, it goes without saying that the temperature data for the substrate thermocouple 211 is not used.

Figure 7A:
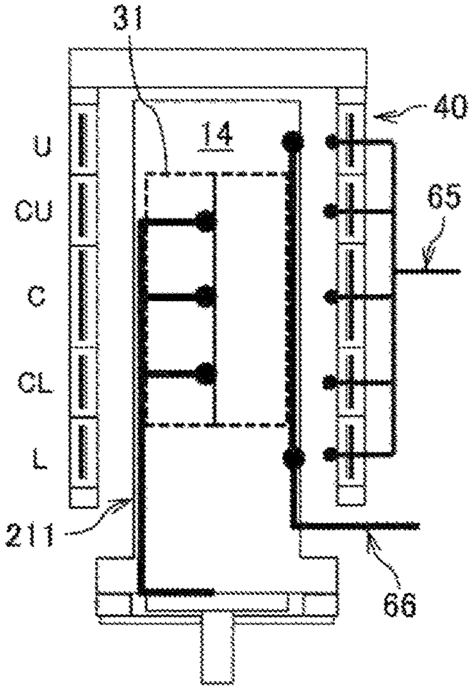
FIG. 7A is a side view illustrating a temperature sensor in a substrate processing apparatus according to embodiments of the present disclosure.

As illustrated in FIG. 7A, when a temperature control area includes the U, CU, C, CL, and L zones and the substrate process region of the boat 31 is located in the CU, C, and CL zones, there is a spatial constraint that prevents the substrate thermocouple 211 from being placed in the U and L zones. In this case, for example, the assignment parameters may be set as illustrated in FIG. 9A (however, fields "4" and "5" in the "BCH" column of FIG. 9A cannot be set (fixed to "00")). With this setting, the heater unit 40 may be controlled based on the temperature detected by the substrate thermocouple 211 in the CU, C, and CL zones and based on the temperature detected by the internal thermocouple 66 in the U and L zones.

Figure 7B:
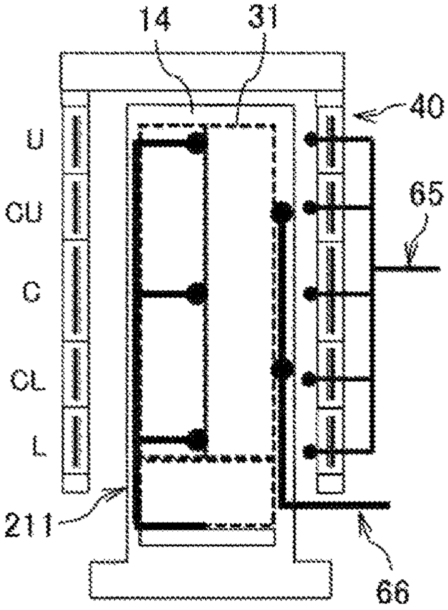
FIG. 7B is a side view illustrating a temperature sensor in a substrate processing apparatus according to embodiments of the present disclosure.

As illustrated in FIG. 7B, when the substrate process region of the boat 31 is located in the U, CU, C, CL, and L zones, there may be a manufacturing constraint that prevents the substrate thermocouple 211 from being placed in the CU and CL zones. In this case, for example, as the assignment parameters illustrated in FIG. 8A, "Type 1" may be selected for the setting item "BTCU," and "06," "08," and "10" are input to the setting item "CH Assignment" respectively corresponding to fields "1" to "3" in the "BCH" column, and "00" is input to the setting item "CH Assignment" corresponding to each of fields "4" and "5" in the "BCH" column. With this setting, the heater unit 40 may be controlled based on the temperature detected by the substrate thermocouple 211 in the U, C, and L zones and based on the temperature detected by the internal thermocouple 66 in the CU and CL zones.

In addition, the case where fields "1" to "5" are displayed in the "BCH" column on the displayer 206 (the number of fields of the setting item "CH Assignment" is fixed to the number of zones (e.g., 5 zones)) is described above. However, in a case where the number of temperature detectors of the substrate thermocouple 211 is smaller than the number of zones, the displayer 206 may be configured to display the number of temperature detectors as the number of fields of the setting item "CH Assignment." As such, according to the embodiments of the present disclosure, when the number of temperature detectors of the substrate thermocouple 211 is smaller than the number of zones, it is possible to detect the temperature in an extra zone by using the internal thermocouple 66 or the heater thermocouple 65. This enables a temperature control with the heater unit 40 by using the temperature sensor arranged in each zone.

Figure 10A:
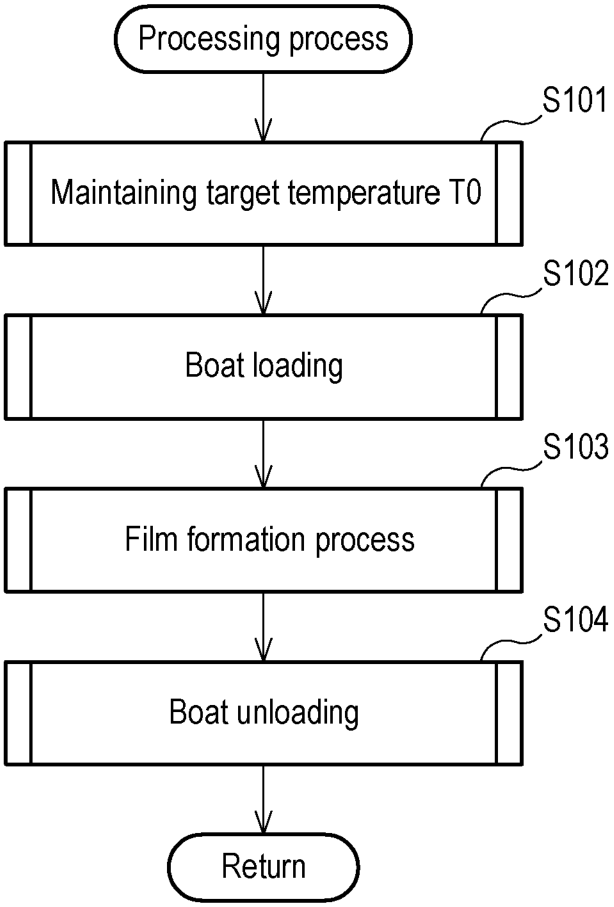
FIG. 10A is a flowchart illustrating a substrate processing sequence performed by a substrate processing apparatus according to embodiments of the present disclosure.
Figure 10B:
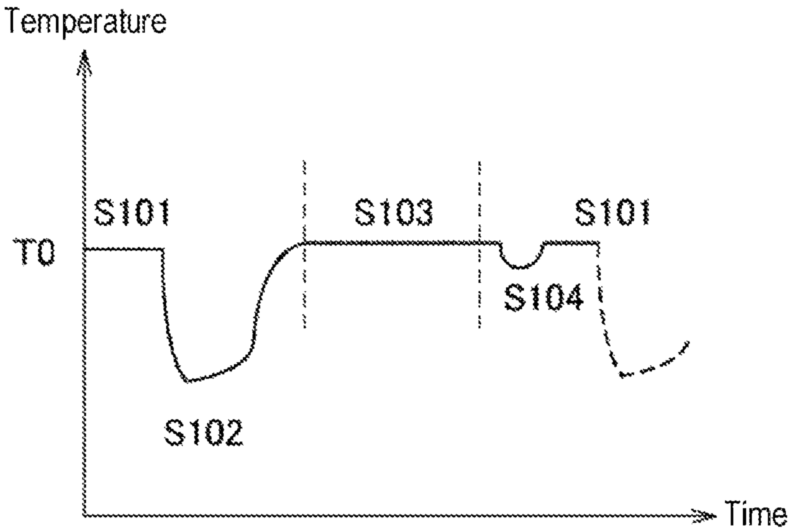
FIG. 10B is a graph illustrating a temperature at each step of a substrate processing sequence performed by a substrate processing apparatus according to embodiments of the present disclosure.

Next, an example of a substrate processing sequence performed by the substrate processing apparatus will be described with reference to FIGS. 10A and 10B.

Step S101 (standby step) is a process of stabilizing the temperature of the process chamber 14 to a target temperature TO of a standby temperature (preparation temperature). In step S101, the substrate 1 is not yet been introduced into the process chamber 14.

Step S102 (boat loading step) is a process of introducing the substrate 1 held in the boat 31 into the process chamber 14. The drive controller 28 raises the boat 31 by the elevator 26 to load the same into the process chamber 14.

Temperatures of the boat 31 and the substrate 1 are lower than the temperature (i.e., T0) of the process chamber 14, before being loaded into the process chamber 14. Further, the introduction of the substrate 1 into the process chamber 14 results in an introduction of an atmosphere (room temperature) outside the process chamber 14 into the process chamber 14. Therefore, as illustrated in FIG. 10B, the temperature of the process chamber 14 temporarily drops below T0. Thereafter, the temperature of the process chamber 14 is again stabilized to T0 after a short period under the control of the temperature controller 64. In FIG. 10B, a target temperature in the next step S103 after the processing substrate is introduced into the process chamber 14 is illustrated as being the same as that in step S101, but the target temperature after the introduction of the substrate may change depending on a condition (process temperature) of step S103.

Step S103 (processing step) is a process of maintaining and stabilizing the temperature of the process chamber 14 at the target temperature T0 of a process temperature to perform a predetermined process on the substrate 1. The temperature controller 64 controls the heater unit 40 such that a temperature measured by a temperature sensor approaches the target temperature T0. For example, the temperature controller 64 controls the heater unit 40 such that the temperature detected by the first temperature sensor approaches the target temperature T0. The process temperature in the present disclosure refers to a temperature of the substrate 1 or a temperature of the process chamber 14.

Step S104 (boat unloading step) is a process of unloading the processed substrate 1, along with the boat 31, from the process chamber 14. The drive controller 28 lowers the boat 31 by the elevator 26 to unload (transport) the same to the transfer chamber 3.

In a case where an unprocessed substrate 1 to be processed remains, the processed substrate 1 is discharged from the boat 31 and is replaced with the unprocessed substrate 1, and a series of processes of Steps S101 to S104 is performed.

Steps S101 to S104 will be performed after obtaining a stable state where the temperature of the process chamber 14 is within a predefined small temperature range for the target temperature and remains for a predefined time or longer.

According to the embodiments of the present disclosure, one or more of the following are acquired.

(a) According to embodiments of the present disclosure, a temperature control system (substrate processing apparatus 10) includes a heater (heater unit 40) arranged in each of a plurality of zones, a first temperature sensor (substrate thermocouple 211) configured to detect a temperature of a substrate 1 while operating in conjunction with the substrate 1, another temperature sensor aside from the first temperature sensor, and a control part (controller 200) configured to be capable of controlling the heater for each zone based on a temperature detected by the first temperature sensor and the another temperature sensor. As a result, since it is possible to detect the temperature by using a temperature sensor (first temperature sensor) closest to the substrate 1, thereby improving a temperature control in a process space (process chamber 14) where the substrate 1 is placed.

(b) According to the embodiments of the present disclosure, the another temperature sensor includes at least a second temperature sensor (internal thermocouple 66) provided at a process space where the substrate 1 is processed and a third temperature sensor (heater thermocouple 65) provided in the vicinity of the heater. Further, the temperature control system (substrate processing apparatus 10) includes a memory part (memory 205) configured to store an assignment parameter that assigns any one of the first temperature sensor, the second temperature sensor, and the third temperature sensor to each zone. As a result, it is possible to arbitrarily assign the temperature sensor closest to the substrate (first temperature sensor) and the other temperature sensors (second temperature sensor and third temperature sensor) to each zone. Accordingly, the first temperature sensor, the second temperature sensor, and the third temperature sensor may be used in combination, thereby improving the temperature control in the process space.

(c) According to the embodiments of the present disclosure, the control part (controller 200) is configured to be capable of arbitrarily selecting at least one selected from the group of the first temperature sensor, the second temperature sensor, and the third temperature sensor for each zone according to contents preset by the assignment parameter. As a result, it is possible to use the temperature sensor closest to the substrate (first temperature sensor) and the other temperature sensors (second temperature sensor and third temperature sensor) in combination, thereby improving the temperature control in the process space.

(d) According to the embodiments of the present disclosure, the control part (controller 200) is configured to be capable of enabling the first temperature sensor to detect a temperature of the process space where the substrate 1 is placed and enabling the another temperature sensor to detect a temperature of the process space where the substrate 1 is not placed. In other words, the controller 200 enables the temperature sensor closest to the substrate 1 (first temperature sensor) to detect a temperature of a region where the substrate 1 is placed and enables the another temperature sensor to detect a temperature of a region where the substrate 1 is not placed. As a result, it is possible to appropriately use the temperature sensors for different regions, enabling the temperature control in the process space.

(e) According to the embodiments of the present disclosure, the first temperature sensor is configured to detect a temperature of a process space in the vicinity of the substrate 1 (for example, between the substrate 1 and the substrate 1). Specifically, the first temperature sensor is positioned in the process space between the substrate 1 and the substrate 1 in a vertical direction (up-and-down direction) and is arranged at a periphery of the substrate 1 in a horizontal direction. Therefore, it is possible to monitor the temperature of the process space of the substrate 1.

(f) According to the embodiments of the present disclosure, the first temperature sensor and the another temperature sensor are arranged in the process space where the substrate 1 is placed such that a height of a temperature detector of each of the first temperature sensor and the another temperature sensor is substantially the same. By arranging the temperature detector of each of the first temperature sensor and the another temperature sensor at the same height, a temperature controllability in the process space where the substrate 1 is placed is significantly improved, enabling a high-precision temperature control.

(g) According to the embodiments of the present disclosure, the control part (controller 200) is configured to be capable of enabling the another temperature sensor to detect a temperature in an extra zone when the number of first temperature sensors is smaller than the number of zones. As a result, it is possible to control the temperature in such a manner that even in a case where the number of substrate thermocouples 211 is smaller than the number of zones due to hardware constraints, the internal thermocouple 66 or the heater thermocouple 65 may compensate for shortage of substrate thermocouples 211.

(h) According to the embodiments of the present disclosure, the control part (controller 200) is configured to be capable of enabling the first temperature sensor to detect a temperature in a zone facing a holder and enabling the another temperature sensor to detect a temperature in a zone not facing the holder. As a result, it is possible to control the temperature by using, in combination, the temperature sensor closest to the substrate 1 and provided at the holder and the another temperature sensor configured to detect the temperature of the region where the substrate 1 is not placed, thereby significantly improving the temperature controllability in the process space.

(i) According to the embodiments of the present disclosure, the control part (controller 200) is configured to be capable of enabling the first temperature sensor to detect a temperature of the process space facing a plurality of zones including a CU zone, a C zone, and a CL zone where the substrate 1 is placed and enabling the another temperature sensor to detect a temperature of the process space facing a plurality of zones including a U zone and a L zone where the substrate is not placed. In other words, the controller 200 enables the temperature sensor closest to the substrate 1 to detect the temperature in the zones where the substrate is placed and enables the another temperature sensor to detect the temperature in the zones where the substrate 1 is not placed. As a result, it is possible to appropriately use the temperature sensors in different regions, enabling the temperature control in the process space.

(j) According to the embodiments of the present disclosure, the temperature control system includes a displayer 206 configured to be capable of designating either the first temperature sensor or the another temperature sensor for each zone. According to this configuration, it is possible to arbitrarily select the temperature sensors for each heater including a plurality of zones. As a result, even in a case where modifications are made, such as transforming from a holder with the first temperature sensor to a holder without the first temperature sensor, or vice versa, setting (modification) of the assignment parameters may be demanded, such that it is possible to perform modifications due to, for example, changes in components (changes in the holder) without changing the program.

The embodiments of the present disclosure are described above. However, the present disclosure is not limited to the above-described embodiments, and may be changed in various ways without departing from the gist thereof.

Other Embodiments

Although one heater (first heater) are described in the above-described embodiments of the present disclosure, a plurality of heaters may be provided actually. For example, there may be a second heater (ceiling heater) and a third heater (furnace opening heater). The ceiling heater is a heater configured to heat a substrate held by a holder (boat) from an upper side of the holder, and the furnace opening heater is a heater configured to heat the substrate held by the holder from a lower side of the holder. These are specifically used to assist in heating substrates arranged at upper and lower ends of the substrate held by the holder, and are also referred to as sub-heaters (or auxiliary heaters). These play a role in assisting the heating of the U zone and L zone of the first heater, respectively.

A ceiling heater thermocouple (fourth temperature sensor) and a furnace opening sub-heater thermocouple (fifth temperature sensor) are respectively provided in the vicinity of the second heater (ceiling heater) and the third heater (furnace opening heater). Designation of these may not be made directly, but, for example, by setting the U zone with another temperature sensor aside from the first temperature sensor, may be made to achieve automatic heating with the ceiling heater and temperature detection by using the ceiling heater thermocouple. Then, another temperature sensor aside from the first temperature sensor refers to at least one selected from the group of the second temperature sensor, the third temperature sensor, the fourth temperature sensor, and the fifth temperature sensor.

In the embodiments of the present disclosure, the ceiling heater thermocouple (fourth temperature sensor) provided at the second heater (ceiling heater) or the furnace opening sub-heater thermocouple (fifth temperature sensor) provided at the third heater (furnace opening heater) may set for each zone on a setting screen of the displayer 206. For example, this allows the first temperature sensor (substrate thermocouple 211) to be set for zones where the substrate is placed, the fourth temperature sensor to be set for a first zone where the substrate is not placed, and the fifth temperature sensor to be set for a fifth zone where the substrate is not placed. This allows the first temperature sensor (temperature sensor closest to the substrate) to detect a temperature in a region where the substrate is placed and other temperature sensors, including the fourth temperature sensor (ceiling heater thermocouple) and the fifth temperature sensor (furnace opening sub-heater thermocouple) aside from the first temperature sensor to detect a temperature in a region where the substrate is not placed.

According to the embodiments of the present disclosure, one or more of the effects (a) to (j) described above and the effect described below are obtained.

(k) The temperature sensors (fourth temperature sensor and fifth temperature sensor) provided in the vicinity of the respective sub-heaters may also be set by using the assignment parameters. Therefore, by setting the assignment parameters on the setting screen, various temperature sensors may be used (combined) arbitrarily, leading to an expected improvement in an accuracy of temperature control in the process space.

The substrate processing apparatus may be applied to a semiconductor manufacturing apparatus and to an apparatus configured to process a glass substrate such as a LCD apparatus. Further, the process may be anything without being particularly limited. For film formation, examples include CVD, PVD, a process of forming an oxide film, a nitride film, or both, and a process of forming a film containing a metal, among others, without being particularly limited to a film type. Further, processes other than film formation, such as annealing, oxidation, nitridation, and diffusion, may be performed.

According to the present disclosure in some embodiments, it is possible to improve a temperature controllability of a process space where a substrate is placed.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature control system comprising:

a heater arranged in each of a plurality of zones;

at least one first temperature sensor configured to be capable of operating in conjunction with at least one substrate;

another temperature sensor aside from the at least one first temperature sensor;

a displayer configured to display an assignment parameter that assigns either the at least one first temperature sensor or the another temperature sensor to each of the plurality of zones; and a controller configured to be capable of controlling the heater based on a temperature detected by either the at least one first temperature sensor or the another temperature sensor, wherein the displayer is configured to be capable of designating either the at least one first temperature sensor or the another temperature sensor for each of the plurality of zones.

2. The temperature control system of claim 1, wherein the another temperature sensor includes at least a second temperature sensor provided at a process space where the at least one substrate is processed and a third temperature sensor provided in a vicinity of the heater.

3. The temperature control system of claim 2, further comprising a memory configured to store an assignment parameter that assigns any one of: (i) the at least one first temperature sensor, (ii) the second temperature sensor, and (iii) the third temperature sensor to each of the plurality of zones.

4. The temperature control system of claim 3, wherein the controller is configured to be capable of selecting any one of: (i) the at least one first temperature sensor, (ii) the second temperature sensor, and (iii) the third temperature sensor for each of the plurality of zones according to a content preset by the assignment parameter.

5. The temperature control system of claim 1, wherein the controller is configured to be capable of enabling the at least one first temperature sensor to detect a temperature of the process space where the at least one substrate is placed and enabling the another temperature sensor to detect a temperature of the process space where the at least one substrate is not placed.

6. The temperature control system of claim 1, wherein the at least one substrate includes a plurality of substrates arranged in a process space, and wherein the at least one first temperature sensor is configured to detect a temperature in the process space between the plurality of substrates while the plurality of substrates arranged in the process space are being processed.

7. The temperature control system of claim 6, wherein the at least one first temperature sensor is configured to detect a temperature of a periphery of the at least one substrate.

8. The temperature control system of claim 1, wherein the at least one first temperature sensor and the another temperature sensor are arranged in a region where the at least one substrate is placed such that a height of a temperature detector of each of: (i) the at least one first temperature sensor and (ii) the another temperature sensor is the same.

9. The temperature control system of claim 1, wherein the controller is configured to be capable of enabling the another temperature sensor to detect a temperature in an extra zone of the plurality of zones when the number of the at least one first temperature sensor is smaller than the number of the plurality of zones.

10. The temperature control system of claim 1, further comprising a holder configured to hold the at least one substrate, wherein the controller is configured to be capable of enabling the at least one first temperature sensor to detect a temperature in a zone of the plurality of zones which faces a region of the holder where the at least one substrate is held and enabling the another temperature sensor to detect a temperature in a zone of the plurality of zones which faces a region of the holder where the at least one substrate is not held.

11. The temperature control system of claim 1, further comprising a holder configured to hold the at least one substrate, wherein the controller is configured to be capable of enabling the at least one first temperature sensor to detect a temperature in a zone of the plurality of zones which faces the holder and enabling the another temperature sensor to detect a temperature in a zone of the plurality of zones which does not face the holder.

12. The temperature control system of claim 11, wherein the at least one first temperature sensor is configured to operate in conjunction with the holder.

13. The temperature control system of claim 1, wherein the displayer is configured to display in a manner so as to be capable of setting whether or not the at least one first temperature sensor is to be used.

14. The temperature control system of claim 2, further comprising a second heater including a fourth temperature sensor and a third heater including a fifth temperature sensor, wherein the controller is configured to be capable of enabling the at least one first temperature sensor to detect a temperature of the process space where the at least one substrate is placed and enabling at least one selected from the group of the fourth temperature sensor and the fifth temperature sensor to detect a temperature of the process space where the at least one substrate is not placed.

15. The temperature control system of claim 14, wherein the controller is configured to be capable of designating either the fourth temperature sensor or the fifth temperature sensor.

16. A method of manufacturing a semiconductor device, comprising:

processing the at least one substrate by controlling a temperature of the at least one substrate with the temperature control system of claim 1.

17. A substrate processing apparatus comprising:

a heater arranged in each of a plurality of zones;

a first temperature sensor configured to be capable of operating in conjunction with a substrate;

another temperature sensor aside from the first temperature sensor;

a displayer configured to display an assignment parameter that assigns either the at least one first temperature sensor or the another temperature sensor to each of the plurality of zones; and a controller configured to be capable of controlling the heater based on a temperature detected by either the first temperature sensor or the another temperature sensor, wherein the displayer is configured to be capable of designating either the at least one first temperature sensor or the another temperature sensor for each of the plurality of zones.

18. A non-transitory computer-readable recording medium storing a program that causes, by a computer, a substrate processing apparatus, which includes a heater arranged in each of a plurality of zones, a first temperature sensor configured to be capable of operating in conjunction with a substrate, another temperature sensor aside from the first temperature sensor, a displayer configured to display an assignment parameter that assigns either the at least one first temperature sensor or the another temperature sensor to each of the plurality of zones, and a controller, to perform:

enabling the controller to control the heater based on a temperature detected by either the first temperature sensor or the another temperature sensor, wherein the displayer is configured to be capable of designating either the at least one first temperature sensor or the another temperature sensor for each of the plurality of zones.

* * * * *